United States Patent
Cai et al.

(10) Patent No.: US 8,735,894 B2
(45) Date of Patent: May 27, 2014

(54) LIGHT EMITTING DIODE PACKAGE STRUCTURE

(75) Inventors: Pei-Song Cai, Hsinchu (TW); Tzu-Pu Lin, Hsinchu (TW); Szu-Wei Fu, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 257 days.

(21) Appl. No.: 13/421,522

(22) Filed: Mar. 15, 2012

(65) Prior Publication Data

US 2012/0235198 A1  Sep. 20, 2012

(30) Foreign Application Priority Data

Mar. 15, 2011 (TW) .............................. 100108668 A

(51) Int. Cl.
*H01L 33/00* (2010.01)
(52) U.S. Cl.
USPC ....................................... 257/65; 257/E33.06

(58) Field of Classification Search
CPC .......................... H01L 25/0753; H01L 33/465
USPC .................. 257/98, E33.06, E33.061; 438/27
See application file for complete search history.

(56) References Cited

U.S. PATENT DOCUMENTS 7,560,748 B2 * 7/2009 Ishizaka et al. ................. 257/99

* cited by examiner

*Primary Examiner* — Julio J Maldonado
*Assistant Examiner* — Daniel Shook

(57) ABSTRACT

The invention provides a light emitting diode package structure, including: a light emitting diode chip formed on a substrate; a composite coating layer formed on the light emitting diode chip, wherein the composite coating layer comprises a first coating layer and a second coating layer, and the composite coating layer has a reflectivity greater than 95% at the wavelength of 500-800 nm; a cup body formed on the substrate, wherein the cup body surrounds the light emitting diode chip; and an encapsulation housing covering the light emitting diode chip, wherein the encapsulation housing comprises a wavelength transformation material.

14 Claims, 2 Drawing Sheets

LIGHT EMITTING DIODE PACKAGE STRUCTURE

CROSS REFERENCE TO RELATED APPLICATIONS

This Application claims priority of Taiwan Patent Application No. 100108668, filed on Mar. 15, 2011, the entirety of which is incorporated by reference herein.

BACKGROUND OF THE INVENTION

1. Field of the Invention

The present invention relates to a light emitting diode, and in particular relates to a light emitting diode package structure.

2. Description of the Related Art

Because light emitting diodes (LED) have several advantages over conventional lamps, such as a longer lifetime, a smaller size, lower power consumption, and higher response speeds, etc., considerable research attention has been recently focused on development thereof.

Conventionally, one way to generate a white light emitting diode (LED) is to coat a yellow phosphor on a blue LED chip. The blue light emitted by the LED chip is then mixed with the complimentary yellow light from phosphor to generate the white light. An LED comprises a semiconductor layer formed on a substrate, such as a GaN layer formed on a sapphire substrate. When the yellow phosphor is illuminated by the semiconductor layer (the reflective index of the GaN is about 2.5) to produce a yellow light, the yellow light may be reflected by a medium with a lower reflective index. Accordingly, an unwanted phenomenon called a "light trapping effect" is produced. Therefore, the light extraction efficiency of the light emitting diode is limited.

Accordingly, there is a need to develop a light emitting diode package structure to reduce or eliminate the light trapping effect to improve the light extraction efficiency of a light emitting diode package structure.

BRIEF SUMMARY OF THE INVENTION

The invention provides a light emitting diode package structure, comprising: a substrate; a light emitting diode chip formed on the substrate; a composite coating layer formed on the light emitting diode chip, wherein the composite coating layer comprises a first coating layer and a second coating layer, and the composite coating layer has a reflectivity greater than 95% at the wavelength of 500-800 nm; a cup body formed on the substrate, wherein the cup body surrounds the light emitting diode chip; and an encapsulation housing covering the light emitting diode chip, wherein the encapsulation housing comprises a wavelength transformation material.

A detailed description is given in the following embodiments with reference to the accompanying drawings.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
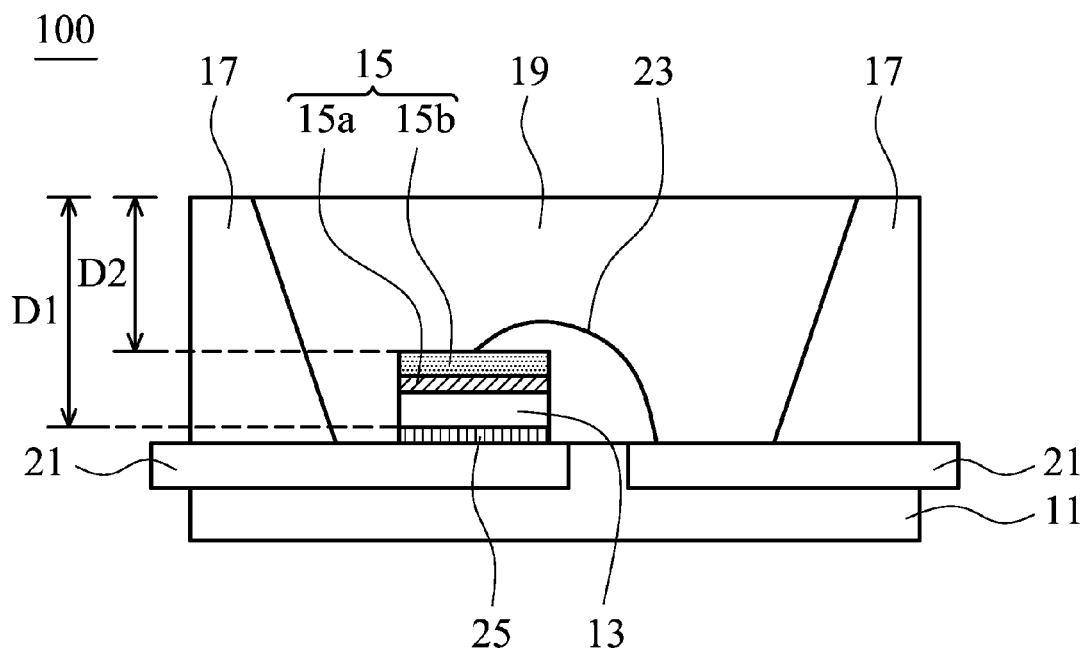
FIG. 1 shows a cross-sectional schematic representation of a light emitting diode package structure in accordance with an embodiment of the invention.

FIG. 1 shows a cross-sectional schematic representation of a light emitting diode package structure 100 in accordance with an embodiment of the invention. The light emitting diode package structure 100 comprises a composite coating layer 15 which has a reflectivity greater than 95% at the wavelength of 500-800 nm. Thus, the most of the visible light (such as green light, yellow light, or red light, etc.) are reflected by the composite coating layer 15 and the light trapping effect may be reduced.

Additionally, the light emitting diode package structure 100 further comprises a substrate 11; a light emitting diode chip 13 formed on the substrate 11; a cup body 17 formed on the substrate 11 and the cup body 17 surrounds the light emitting diode chip 13; and a encapsulation housing 19 covering the light emitting diode chip 13.

Furthermore, the light emitting diode package structure 100 further comprises a lead frame 21 formed on the substrate 11; and at least one wire 23 electrically connected to the light emitting diode chip 13 and the lead frame 21.

The light emitting diode chip 13 emits a light at the wavelength of 400-500 nm (in the range of blue light) and is composed by a sub-substrate (not shown in figure) and a semiconductor layer (not shown in figure), wherein the sub-substrate comprises sapphire or silicon carbide, and the semiconductor layer comprises GaN, AlGaN or InGaN.

The composite coating layer 15 comprises a first coating layer 15a and a second coating layer 15b. The first coating layer 15a and the second coating layer 15b are individually formed of different material and individually have different reflective index. The first coating layer 15a and the second coating layer 15b independently comprises $TiO_2$, $SiO_2$, $Ta_2O_5$, $HfO_2$, $ZrO_2$, $WO_3$, $Nb_2O_5$, $Al_2O_3$, $MgO$, $Nd_2O_3$ or $ZnO$.

The composite coating layer 15 of the invention has at least two layers. The reflective index of the composite coating layer 15 is higher than that of the substrate 11 to increase the reflectivity of a surface of the composite coating layer 15. Furthermore, the composite coating layer 15 may be formed by alternatively coating a high reflective index material and a low reflective index material. Each layer of the composite coating layer 15 has a thickness of about one-quarter of the emission wavelength of light. With the increase in the number of the composite coating layer 15, the amplitude of the light is increased and the reflectivity of the composite coating layer 15 is also improved.

In one embodiment, the first coating layer 15a is $TiO_2$ with a thickness of about 20-1000 nm, and the second coating layer 15b is $SiO_2$ with a thickness of about 20-1000 nm. Note that the composite coating layer 15 has a reflectivity greater than 95% at the wavelength of 500-800 nm, and the thickness of the first coating layer and the second coating layer are not limited to the above-mentioned range. Those skilled in the art may adjust the thickness of the first coating layer and the second coating layer according to the actual application.

The composite coating layer 15 may be formed by a chemical vapor deposition (CVD), spin-on processing, sputter method or other suitable method.

The composite coating layer 15 has a reflectivity greater than 95% at the wavelength of 500-800 nm, and a reflectivity greater than 90% at the wavelength of 400-500 nm. Thus, the composite coating layer 15 has a high transmission at the blue light wavelength and a high reflectivity at the yellow light wavelength. The yellow light may not be trapped by the light emitting diode chip 13, and the light trapping effect is reduced effectively.

Figure 2:
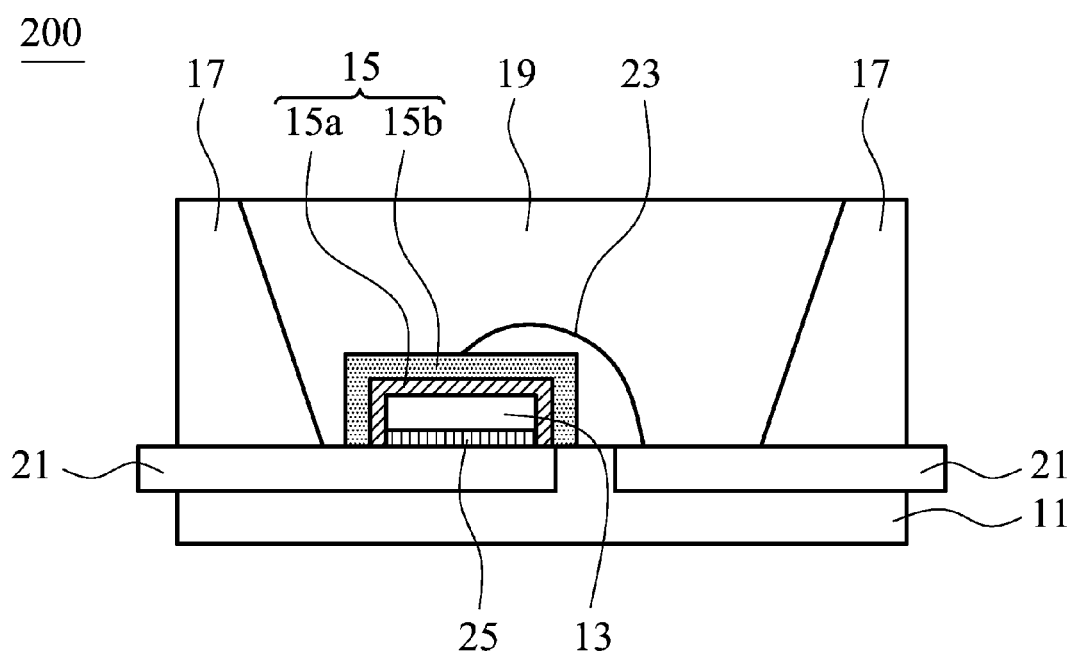
FIG. 2 shows a cross-sectional schematic representation of a light emitting diode package structure in accordance with a second embodiment of the invention.

Furthermore, FIG. 2 shows a cross-sectional schematic representation of a light emitting diode package structure 200 in accordance with a second embodiment of the invention. Besides being formed on the light emitting diode chip 13, a portion of the composite coating layer 15 is formed on the sidewalls of the light emitting diode chip. In other words, the composite coating layer 15 is formed on the five surfaces of the light emitting diode chip 13 (top surface and four sidewalls).

Figure 3:
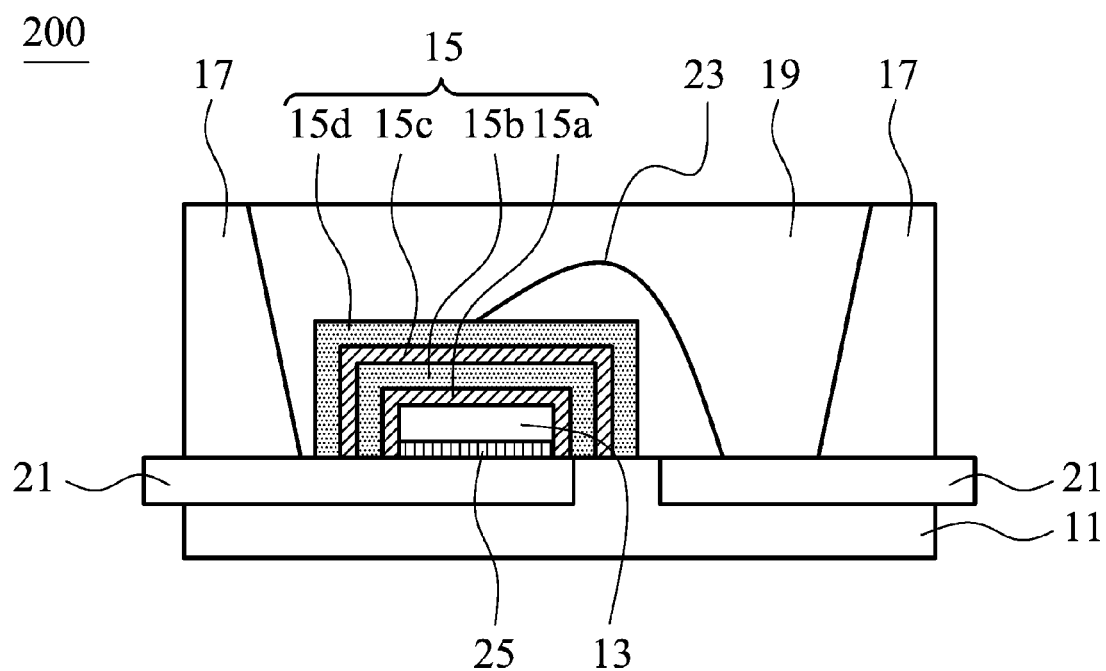
FIG. 3 shows a cross-sectional schematic representation of a light emitting diode package structure in accordance with a third embodiment of the invention.

Furthermore, FIG. 3 shows a cross-sectional schematic representation of a light emitting diode package structure in accordance with a third embodiment of the invention. The composite coating layer 15 further comprises a third coating layer 15c and a fourth coating layer 15d, the first coating layer 15a and the third coating layer 15c are formed of the same material, and the second coating layer 15b and the fourth coating layer 15d are formed of the same material. Note that the composite coating layer 15 may comprise two layers, four layers, six layers, eight layers or multi-layers, and is not limited by the above-mentioned numbers. Note that two adjacent coating layers must have different refractive indexes, and the number and the thickness of the composite coating layer may be adjusted by those skilled in the art according to the actual application.

The encapsulation housing 19 comprises a wavelength transformation material, such as a phosphor powder, quantum dot or organic emitting material. A wavelength of light emitted from the light emitting diode chip 13 is transferred to a desirable wavelength of light by the encapsulation housing 19. In one embodiment, by using YAG phosphor powder, a yellow light is obtained by transferring a blue light emitted by the light emitting diode chip 13. The light emitting diode chip 13 further comprises a bottom reflective layer 25 formed on a bottom of the light emitting diode chip 13. The function of the bottom reflective layer 25 is to reflect the light emitted from the light emitting diode chip 13 to improve the light emitting efficiency of the light emitting diode package structure. The bottom reflective layer 25 comprises silver (Ag), nickel (Ni), alumina (Al), tungsten (W), titanium (Ti), platinum (Pt) or combinations thereof. In one preferred embodiment, a silver layer is used as the bottom reflective layer 25 of the light emitting diode chip 13.

Before forming the composite coating layer 15, the trapped light is reflected only by the help of the bottom reflective layer 25 of the light emitting diode chip 13, and thus the equivalent cup depth is D1. Note that by the design of the composite coating layer 15, the trapped light is reflected by the composite coating layer 15 and the bottom reflective layer 25, and thus the light trapping efficiency is reduced and the equivalent cup depth is reduced from D1 to D2. Therefore, the reflectivity to the yellow light is increased from 90% (only by the bottom reflective layer 25) to 95% (by the bottom reflective layer 25 and composite coating layer).

From the above discussion, the light emitting diode package structures 100, 200 have the following advantages:

(1) The composite coating layer 15 has a high transmission at the blue light wavelength and a high reflectivity at the yellow light wavelength. The yellow light may not be trapped by the light emitting diode chip 13, and the light trapping effect is reduced effectively;

(2) the composite coating layer 15 is formed on the light emitting diode chip 13 to reduce the equivalent cup depth; and (3) by the design of the composite coating layer 15, the reflectivity of the light emitting diode package structure is improved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light emitting diode package structure, comprising:
   a substrate;
   a light emitting diode chip formed on the substrate;
   a composite coating layer formed on the light emitting diode chip, wherein the composite coating layer comprises a first coating layer and a second coating layer, and the composite coating layer has a reflectivity greater than 95% at the wavelength of 500-800 nm;
   a cup body formed on the substrate, wherein the cup body surrounds the light emitting diode chip; and
   an encapsulation housing covering the light emitting diode chip, wherein the encapsulation housing comprises a wavelength transformation material.

2. The light emitting diode package structure as claimed in claim 1, further comprising:
   a lead frame formed on the substrate.

3. The light emitting diode package structure as claimed in claim 2, further comprising:
   at least one wire electrically connected to the light emitting diode chip and the lead frame.

4. The light emitting diode package structure as claimed in claim 1, wherein the light emitting diode chip emits a light at the wavelength of 400-500 nm, and the wavelength transformation material emits a light at the wavelength of 500-800 nm.

5. The light emitting diode package structure as claimed in claim 1, wherein the composite coating layer has a reflectivity greater than 90% at the wavelength of 400-500 nm.

6. The light emitting diode package structure as claimed in claim 1, wherein a portion of the composite coating layer further formed on the sidewall of the light emitting diode chip.

7. The light emitting diode package structure as claimed in claim 1, wherein the first coating layer and the second coating layer are individually formed of different material.

8. The light emitting diode package structure as claimed in claim 1, wherein the first coating layer and the second coating layer individually have different reflective index.

9. The light emitting diode package structure as claimed in claim 1, wherein first coating layer and the second coating layer independently comprise $TiO_2$, $SiO_2$, $Ta_2O_5$, $HfO_2$, $ZrO_2$, $WO_3$, $Nb_2O_5$, $Al_2O_3$, $MgO$, $Nd_2O_3$ or $ZnO$.

10. The light emitting diode package structure as claimed in claim 1, wherein the composite coating layer further comprises a third coating layer and a fourth coating layer, wherein the fist coating layer and the third coating layer are formed of the same material, and the second coating layer and the fourth coating layer are formed of the same material.

11. The light emitting diode package structure as claimed in claim 1, wherein the composite coating layer is formed by a chemical vapor deposition (CVD), spin-on processing or sputter method.

12. The light emitting diode package structure as claimed in claim 1, further comprising a bottom reflective layer forming on a bottom of the light emitting diode chip.

13. The light emitting diode package structure as claimed in claim 12, wherein the bottom reflective layer comprises silver (Ag), nickel (Ni), alumina (Al), tungsten (W), titanium (Ti), platinum (Pt) or combinations thereof.

14. The light emitting diode package structure as claimed in claim 1, wherein the wavelength transformation material comprises a phosphor powder, quantum dot or organic emitting material.

* * * * *